US012241395B1

(12) United States Patent
Wilson

(10) Patent No.: US 12,241,395 B1
(45) Date of Patent: Mar. 4, 2025

(54) TECHNIQUES FOR CALIBRATING A CATALYTIC CONVERTER SIMULATION

(71) Applicant: FCA US LLC, Auburn Hills, MI (US)

(72) Inventor: John P Wilson, Waterford, MI (US)

(73) Assignee: FCA US LLC, Auburn Hills, MI (US)

( * ) Notice: Subject to any disclaimer, the term of this patent is extended or adjusted under 35 U.S.C. 154(b) by 0 days.

(21) Appl. No.: 18/494,022

(22) Filed: Oct. 25, 2023

(51) Int. Cl.
*F01N 11/00* (2006.01)
*G06F 30/15* (2020.01)

(52) U.S. Cl.
CPC .............. *F01N 11/00* (2013.01); *G06F 30/15* (2020.01); *F01N 2900/1614* (2013.01); *F01N 2900/1618* (2013.01)

(58) Field of Classification Search
CPC ............. F01N 11/00; F01N 2900/1614; F01N 2900/1618; G06F 30/15
See application file for complete search history.

(56) References Cited

FOREIGN PATENT DOCUMENTS

| CN | 108345933 A | 7/2018 |
|---|---|---|
| CN | 109146188 A | 1/2019 |
| CN | 111123871 A | 5/2020 |
| WO | WO-2020259790 A1 * | 12/2020 |

OTHER PUBLICATIONS

Konstantas, G., et al., "A Unified Approach for Modeling Three-Way Catalytic Converters and NOx Traps with a Minimum Set of Tunable Parameters", Chemical Product and Process Modeling, vol. 2, Issue 3, Sep. 29, 2007.

Mack, J., "Calibration of Automotive Aftertreatment Models through Co-Simulation with MATLAB Optimization Routines", The Ohio State University, 2016.

Mandloi, D., dhinagar PhD, S., and Das, H., "An Optimization-Based Framework for Dynamic Model Development for a Three-Way Catalytic Converter Suitable for Urban Driving Condition," SAE Technical Paper2021-24-0078, 2021.

Ramanathan, K., et al., "Kinetic Parameters Estimation for Three Way Catalyst Modeling", American Chemical Society, Jul. 21, 2011.

Schürholz, K., et al., "Modeling of the Three-way Catalytic Converter by Recurrent Neural Networks", ScienceDirect, vol. 51, Issue 15, 2018.

Zhou, Q., et al., "Neural Network-Based Modeling and Optimization for Effective Vehicle Emission Testing and Engine Calibration", Chemical Engineering Communications, vol. 195, Issue 6, 2008.

* cited by examiner

*Primary Examiner* — Brandon D Lee
(74) *Attorney, Agent, or Firm* — Jeremy J. Klobucar

(57) ABSTRACT

Techniques for calibrating a catalyst model for a chemical reaction by a catalyst (e.g., a vehicle three-way catalytic converter) including optimizing an A-value for the chemical reaction by running the catalyst model and adjusting the A-value until results of the catalyst model are within a first threshold of the test data and setting the A-value to the optimized A-value, optimizing an E-value for the chemical reaction by running the catalyst model and adjusting the E-value until the catalyst model results are minimized relative to the test data within a second threshold of the test data, determining a new A-value based on the optimized E-value and setting the A-value to the new A-value and the E-value to the optimized E-value, and determining a reoptimized A-value by running the catalyst model and adjusting the A-value until the catalyst model results are within a third threshold of the test data.

20 Claims, 9 Drawing Sheets

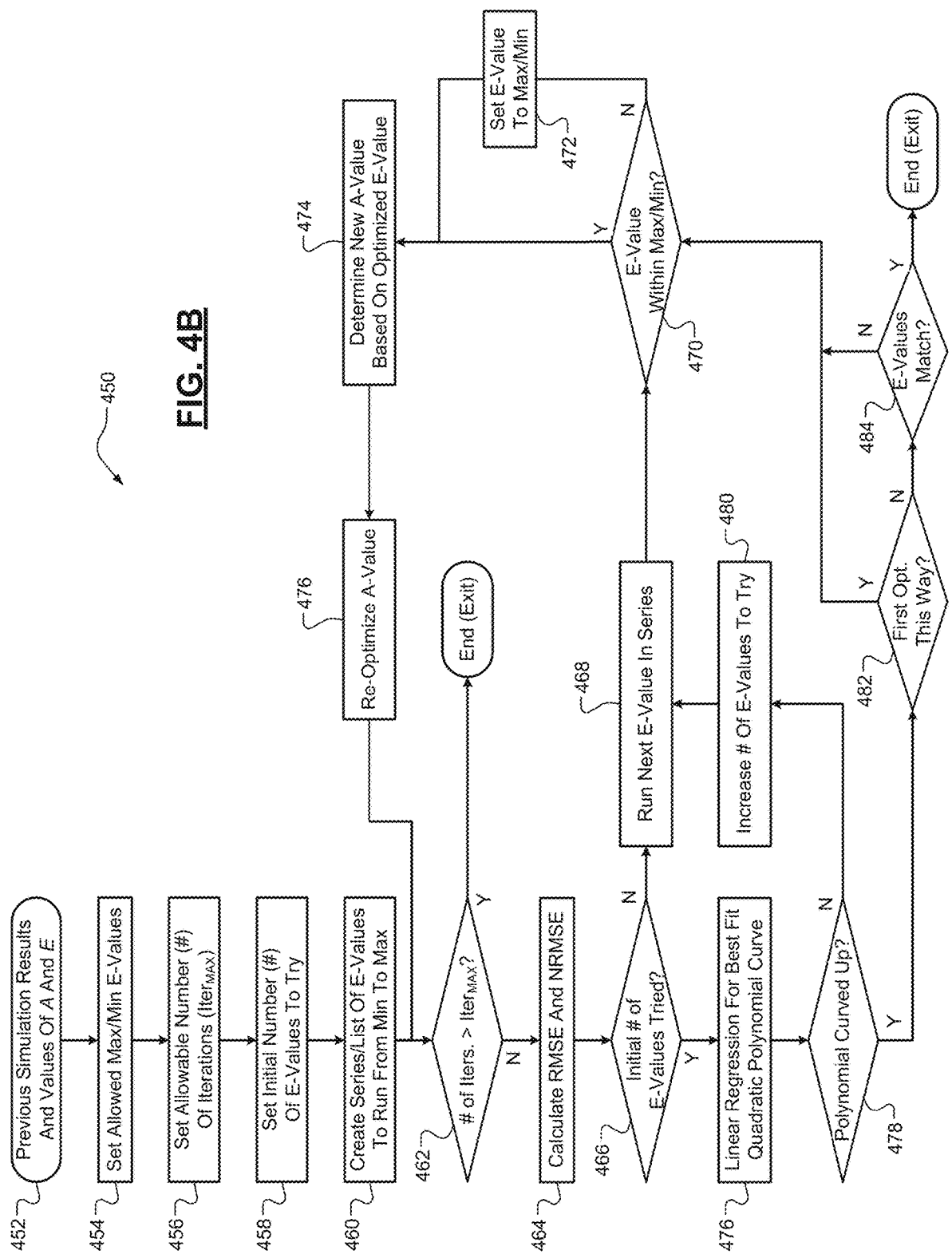

TECHNIQUES FOR CALIBRATING A CATALYTIC CONVERTER SIMULATION

FIELD

The present application generally relates to catalytic converters and, more particularly, to techniques for calibrating a catalytic converter simulation.

BACKGROUND

An internal combustion engine combusts a mixture of air and fuel (e.g., gasoline) to generate torque. Exhaust gas resulting from this combustion is treated by an exhaust system to mitigate or eliminate emissions. One example exhaust system device is a three-way catalytic converter that catalyze a redox reaction to convert carbon monoxide (CO), hydrocarbons (HC), and nitrogen oxides (NOx) to safer emissions such as carbon dioxide ($CO_2$), water ($H_2O$), and the like. The process of selecting an optimal catalytic converter (size, precious metal loading, etc.) for a particular vehicle application typically involves simulation or modeling to verify the catalytic converter's performance and save costs on physical parts and test cells. To create a catalytic converter model, physical testing must be performed, and the model must be calibrated to match the test data. Calibration of the catalytic converter simulation or model takes a human engineer a significant amount of time. Accordingly, while such conventional catalytic converter simulation/modeling techniques do work well for their intended purpose, there exists an opportunity for improvement in the relevant art.

SUMMARY

According to one example aspect of the invention, a calibration system for a catalyst model for a catalyst is presented. In one exemplary implementation, the calibration system comprises a test data database configured to store test data relating to the operation and production of exhaust gas by a source and treatment of the exhaust gas by the catalyst, and a computer system configured to generate and calibrate a catalyst model for a chemical reaction by the catalyst, the catalyst model being based on the Arrhenius equation and defined by A-value representing a pre-exponential factor and an E-value representing an activation energy, including optimizing the A-value by running the catalyst model and adjusting the A-value until results of the catalyst model are within a first threshold of the test data and setting the A-value to the optimized A-value, optimizing the E-value by running the catalyst model and adjusting the E-value until the catalyst model results are minimized relative to the test data within a second threshold of the test data, determining a new A-value based on the optimized E-value and setting the A-value to the new A-value and the E-value to the optimized E-value, and determining a reoptimized A-value by running the catalyst model and adjusting the A-value until the catalyst model results are within a third threshold of the test data.

In some implementations, the catalyst is an exhaust system catalyst and the source is an internal combustion engine of a vehicle, and wherein the computer system is further configured to determine whether the exhaust system catalyst is suitable for a particular vehicle application based on the calibrated catalyst model. In some implementations, the computer system is configured to optimize the A-value by iteratively determining an error between an average of the catalyst model results and an average of the test data, when the error is less than an error threshold, determining the optimized A-value, when the error is not less than the error threshold, calculating a ratio between the average catalyst model results to the average test data, calculating a limited correction factor by raising the calculated ratio to a power of an exponent, multiplying the A-value by the limited correction factor, determining whether the A-value is bounded, and tuning the A-value based on a semi-log interpolation.

In some implementations, the computer system is configured to optimize the E-value by setting maximum/minimum values for the E-value, a maximum number of iterations, and a number of iterations to try, and determining a series of the E-values based thereon, and optimizing the E-value by iteratively calculating root-mean squared error (RMSE) for each time step of the catalyst model results and the test data, calculating normalized RMSE (NRMSE) by averaging the RMSE values and dividing by an average of the test data, when the number of iterations has been complete, calculating a linear regression to find a best fit quadratic polynomial curve, and determining the optimized E-value that corresponds to the minimum NRMSE. In some implementations, the computer system is further configured to set the number of iterations to try equal to three.

In some implementations, the computer system is further configured to set the number of iterations to an initial number of iterations to try and determining the series of E-values based thereon, and optimizing the E-value includes determining whether the quadratic polynomial curve is valley shaped having a positive second derivative or hill shaped having a negative second derivative, and when the quadratic polynomial curve is hill shaped, increasing the number of iterations to try. In some implementations, the catalyst is an exhaust system catalyst and the source is an internal combustion engine of a vehicle, and wherein the exhaust system catalyst is a three-way catalytic converter configured to mitigate or eliminate exhaust gas components including carbon monoxide (CO), hydrocarbons (HC), and nitrogen oxides (NOx), and wherein the calibrated catalyst model is for a chemical reaction of one of CO, HC, and NOx.

In some implementations, the catalyst is configured to generate an intermediate exhaust gas component during treatment of the exhaust gas, and wherein the calibrated catalyst model is for this intermediate exhaust gas component. In some implementations, the computer system is configured to calibrate the catalyst model for the intermediate exhaust gas component by optimizing the A-value and the E-value by iteratively multiplying the A-value based on an inverse of the limited correction factor. In some implementations, the intermediate exhaust gas component is ammonia ($NH_3$).

According to another example aspect of the invention, a calibration method for a catalyst model for a catalyst is presented. In one exemplary implementation, the calibration method comprises establishing a test data database storing test data relating to the operation and production of exhaust gas by a source and treatment of the exhaust gas by the catalyst, generating, by a computer system, a model for a chemical reaction by the catalyst, the model being based on the Arrhenius equation and defined by A-value representing a pre-exponential factor and an E-value representing an activation energy, and calibrating, by the computer system, the catalyst model by optimizing the A-value by running the catalyst model and adjusting the A-value until results of the catalyst model are within a first threshold of the test data and setting the A-value to the optimized A-value, optimizing the E-value by running the catalyst model and adjusting the E-value until the catalyst model results are minimized relative to the test data within a second threshold of the test data, determining a new A-value based on the optimized E-value and setting the A-value to the new A-value and the E-value to the optimized E-value, and determining a reoptimized A-value by running the catalyst model and adjusting the A-value until the catalyst model results are within a third threshold of the test data.

In some implementations, the catalyst is an exhaust system catalyst and the source is an internal combustion engine of a vehicle, and further comprising determining, by the computer system, whether the exhaust system catalyst is suitable for a particular vehicle application based on the calibrated catalyst model. In some implementations, optimizing the A-value further comprises iteratively determining an error between an average of the catalyst model results and an average of the test data, when the error is less than an error threshold, determining the optimized A-value, when the error is not less than the error threshold, calculating a ratio between the average catalyst model results to the average test data, calculating a limited correction factor by raising the calculated ratio to a power of an exponent, multiplying the A-value by the limited correction factor, determining whether the A-value is bounded, and tuning the A-value based on a semi-log interpolation.

In some implementations, optimizing the E-value further comprises setting, by the computer system, maximum/minimum values for the E-value, a maximum number of iterations, and a number of iterations to try, and determining a series of the E-values based thereon, and optimizing, by the computer system, the E-value by iteratively calculating RMSE for each time step of the catalyst model results and the test data, calculating NRMSE by averaging the RMSE values and dividing by an average of the test data, when the number of iterations has been complete, calculating a linear regression to find a best fit quadratic polynomial curve, and determining the optimized E-value that corresponds to the minimum NRMSE. In some implementations, the computer system is further configured to set the number of iterations to try equal to three.

In some implementations, setting the number of iterations includes setting the number of iterations to an initial number of iterations to try and determining the series of E-values based thereon, and optimizing the E-value includes determining whether the quadratic polynomial curve is valley shaped having a positive second derivative or hill shaped having a negative second derivative, and when the quadratic polynomial curve is hill shaped, increasing the number of iterations to try. In some implementations, the catalyst is an exhaust system catalyst and the source is an internal combustion engine of a vehicle, and wherein the exhaust system catalyst is a three-way catalytic converter configured to mitigate or eliminate exhaust gas components including CO, HC, and NOx, and wherein the calibrated catalyst model is for a chemical reaction of one of CO, HC, and NOx.

In some implementations, the catalyst is configured to generate an intermediate exhaust gas component during treatment of the exhaust gas, and wherein the calibrated catalyst model is for this intermediate exhaust gas component. In some implementations, calibrating the catalyst model for the intermediate exhaust gas component comprises optimizing, by the computer system, the A-value and the E-value by iteratively multiplying the A-value based on an inverse of the limited correction factor. In some implementations, the intermediate exhaust gas component is $NH_3$.

Further areas of applicability of the teachings of the present application will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present application are intended to be within the scope of the present application.

BRIEF DESCRIPTION OF THE DRAWINGS

FIGS. 3 and 4A-4B are flow diagrams of example calibration methods for catalyst models for an exhaust system catalyst according to the principles of the present application;

DESCRIPTION

Figure 1:
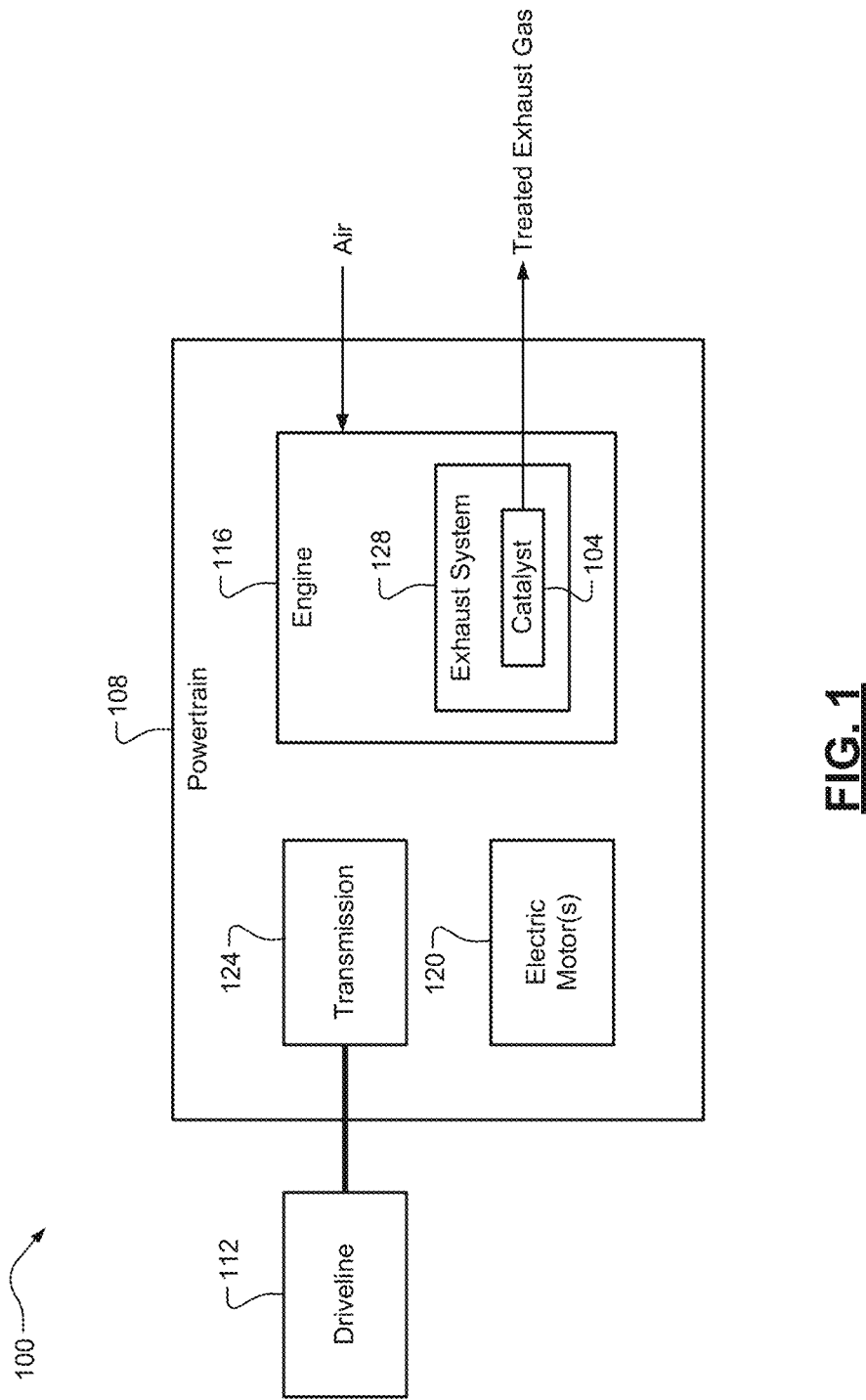
FIG. 1 is a diagram of a vehicle having an exhaust system including an example exhaust system catalyst selected according to the principles of the present application.

As previously discussed, the process of selecting an optimal catalytic converter (size, precious metal loading, etc.) for a particular vehicle application typically involves simulation or modeling to verify the catalytic converter's performance and save costs on physical parts and test cells. To create a catalytic converter model, physical testing must be performed, and the model must be calibrated to match the test data. Calibration of the catalytic converter simulation or model, however, takes a human engineer a significant amount of time. This is primarily because the model will simulate dozens of different chemical reactions. While a three-way catalytic converter is specifically discussed herein, it will be appreciated that the techniques of the present application could be applicable to any suitable exhaust system catalyst (and thus the term "catalyst model" will also be used herein). In a manual approach, the process of calibrating a catalyst model involves the human engineer taking a guess as to what the right settings should be, running the model, looking at the results, then taking another guess until the simulation (e.g., for carbon monoxide, or CO) looks about right (simulations match test data reasonably well). This is repeated for dozens of chemical reactions and emission species (hydrocarbons (HC), nitrogen oxides (NOx), etc.). Because changing one reaction also affects other reactions, many reactions need to be calibrated multiple times until a reasonable overall solution is found.

In another genetic algorithm type approach, many guesses are made, simulations are run with those guesses, it is determined which guesses get closest to the test data, then aspects of the best guesses are combined and the process is repeated. This lengthy and cumbersome process could be run overnight without human engineer oversight, but the first set of guesses are completely random (within a specified range). A simulation is run for each guess and no simulation "learns" from the previous simulations until the initial set of guesses is complete. That is, if the process happens to get close to the target, it still just takes another random shot in any direction. The genetic approach is therefore not efficient and not very "smart" or logical. Thus, it would be desirable to create computer-based simulation or model calibration techniques that can perform various aspects of the catalyst model calibration without the need for any (or extensive) human engineer involvement, thereby saving time and money in completing this process. This could be particularly useful for an original equipment manufacturer (OEM) that has to select or optimize exhaust system catalysts for a large number of different vehicle applications. Such techniques could also help in the ability to create more catalyst models, which could increase efficiency at predicting emissions based on catalyst models.

Accordingly, computer-based systems and methods for calibrating simulations or models of vehicle exhaust system catalysts are presented herein. While a three-way catalytic converter is the most likely exhaust system catalyst and is specifically discussed herein, it will be appreciated that the techniques of the present application could be applicable to other suitable exhaust system catalysts (oxidation catalysts, selective catalytic reduction catalysts, NOx traps, etc.). It will also be appreciated that the techniques of the present application could be applicable to applications other than vehicles, including the modeling and calibration of any suitable chemical reactions in an "exhaust gas" (e.g., a collection of residual gases after the chemical reaction(s) occur) produced by a source (a fuel cell system, a power plant, etc.). The techniques involve initially obtaining and storing test data (e.g., in a test data database or datastore, such as a non-transitory computer memory). The test data relates to the operation and production of exhaust gas by an internal combustion engine and treatment by a particular exhaust treatment catalyst. A computer system (i.e., one or more computing devices) are configured to generate a catalyst model for a chemical reaction by the exhaust treatment catalyst and to calibrate the catalyst model using the test data. This process is executable without any or with minimum human engineer involvement/oversight and thus has the potential to save significant development/calibration time and costs for selecting an optimal exhaust system catalyst for a particular vehicle application.

While the catalyst model may be capable of simulating a plurality (e.g., dozens) of different chemical reactions, it is easier to explain and understand the process by talking about one species (i.e., one particular exhaust gas component, such as CO) and one reaction (i.e., $CO+\frac{1}{2}O_2=CO_2$). The same method can then be applied to many other reactions. Each reaction rate is based on the Arrhenius equation (1), which is reproduced below:

$$k = A \cdot e^{-E/RT} \qquad (1),$$

where k is a reaction rate constant, A is the pre-exponential factor, E is the activation energy, R is the ideal gas constant, and T is the absolute temperature. Each chemical reaction will have different values for the A and E, so the reaction rate will be different for each chemical reaction. While the Arrhenius equation is not a perfect representation of chemical reaction rates, it is quite good and is widely accepted and used. The pre-exponential factor A and activation energy E are the main parameters to calibrate the reaction. The calibration process for the catalyst model generally involves the computer system optimizing the value for A (hereinafter, the "A-value") and the value for E (hereinafter, the "E-value") of the catalyst model.

This process could include, for example, (i) optimizing the A-value by running the catalyst model and adjusting the A-value until results of the catalyst model are within a first threshold of the test data and setting the A-value to the optimized A-value and (ii) optimizing the E-value by running the catalyst model and adjusting the E-value until the catalyst model results are minimized relative to the test data within a second threshold of the test data. After optimizing the E-value, a new A-value could then be determined based on the optimized E-value and setting the A-value to the new A-value and the E-value to the optimized E-value and a reoptimized A-value could then be determined by running the catalyst model and adjusting the A-value until the catalyst model results are within a third threshold of the test data. For example, the third threshold could be the same as the first threshold, but it will also be appreciated that a slightly different third threshold could be utilized. After the catalyst model is fully calibrated, it could be utilized (e.g., by the computer system) to determine whether the exhaust system catalyst is suitable for a particular vehicle application based on the calibrated catalyst model. In some implementations, an exhaust gas component is generated during treatment of the exhaust gas and the catalyst model includes this generated exhaust gas component. The calibration process could include optimizing the A-value and the E-value by iteratively multiplying the A-value based on an inverse of the limited correction factor. For example only, the generated exhaust gas component could be ammonia ($NH_3$).

Now that the process has been explained for the optimization of the A-value for one reaction, it will be appreciated that this process can be employed to optimize multiple reactions. The multiple reactions could be optimized either in series or in parallel. For example, the A-value for both the $CO+\frac{1}{2}O2=CO2$ reaction and the $H2+\frac{1}{2}O2=H2O$ reaction could be adjusted between each run of the simulation with the same logic. These reactions, however, will affect each other since both use O2. Thus, because each reaction affects (directly or indirectly) the other reactions, there may be a need at times to assume the A-value is not bounded (or to "unbound" the A-value), or to simply skip step 332 and go to step 344.

Referring now to FIG. 1, a functional block diagram of a vehicle 100 having an example exhaust system catalyst 104 selected according to the principles of the present application is illustrated. The vehicle 100 is powered by a powertrain 108 that generates and transfers torque to a driveline 112 for vehicle propulsion. The powertrain 108 includes at least an internal combustion engine 116 and could also include one or more optional electric motors 120. The engine 116 is configured to combust a mixture of air and liquid fuel (e.g., gasoline) within cylinders (not shown) to drive respective pistons (not shown) and generate torque at a crankshaft (not shown). A transmission 124, such as a multi-speed automatic transmission, is configured to transfer the torque from the engine 116 to the driveline 112. Alternatively, the engine 116 could generate energy (e.g., electricity) for immediate use by the electric motor(s) 120 or storage (e.g., in a battery system) for later use. Exhaust gas resulting from combustion is expelled from the cylinders of the engine 116 and into an exhaust system 128 of the engine 116. The exhaust system 128 includes an exhaust manifold (not shown) and the exhaust system catalyst 104, such as a three-way catalytic converter, that is selected/optimized for the particular engine/vehicle application using the techniques of the present application. Again, while a three-way catalytic converter is specifically discussed herein, it will be appreciated that the techniques of the present application could be applicable to other suitable exhaust system catalysts or fuel cells. This exhaust system catalyst 104 is selected/optimized using a separate calibration system/method, which will now be described in greater detail.

Figure 2:
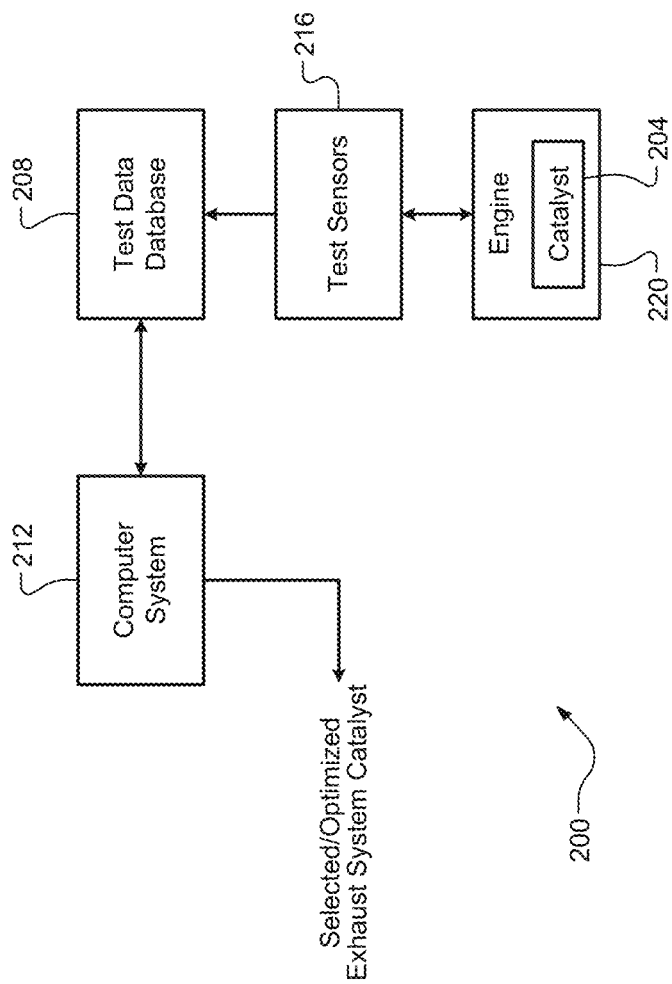
FIG. 2 is a functional block diagram of an example calibration system for a catalyst model for an exhaust system catalyst according to the principles of the present application.

Referring now to FIG. 2, a functional block diagram of an example calibration system 200 for a catalyst model for an exhaust system catalyst 204 (e.g., exhaust system catalyst 104) according to some implementations of the present application is illustrated. The calibration system 200 primarily includes a test data datastore or database 208 (e.g., a non-transitory memory) and a computer system 212 for calibrating the catalyst model. The test data database 208 is configured to store test data relating to the operation of an engine 220 (e.g., engine 116) and its production of exhaust gas and the treatment of the exhaust gas by the exhaust system catalyst 204. This test data could be predetermined and gathered based on previously run tests/experiments, such as using test sensors 216. The computer system 212 includes one or more computing devices configured to execute calibration software or a calibration process as described more fully herein. Each catalyst model could be configured to model a single chemical reaction or a set of chemical reactions. For purposes of the present application and this description, the calibration of a catalyst model with respect to a single exhaust gas component (CO, HC, NOx, etc.) will be described. In some implementations, the catalyst model could be configured to model the production and conversion of a generated exhaust gas component, such as ammonia ($NH_3$) in an inverse manner as the other exhaust gas components.

Figure 3:
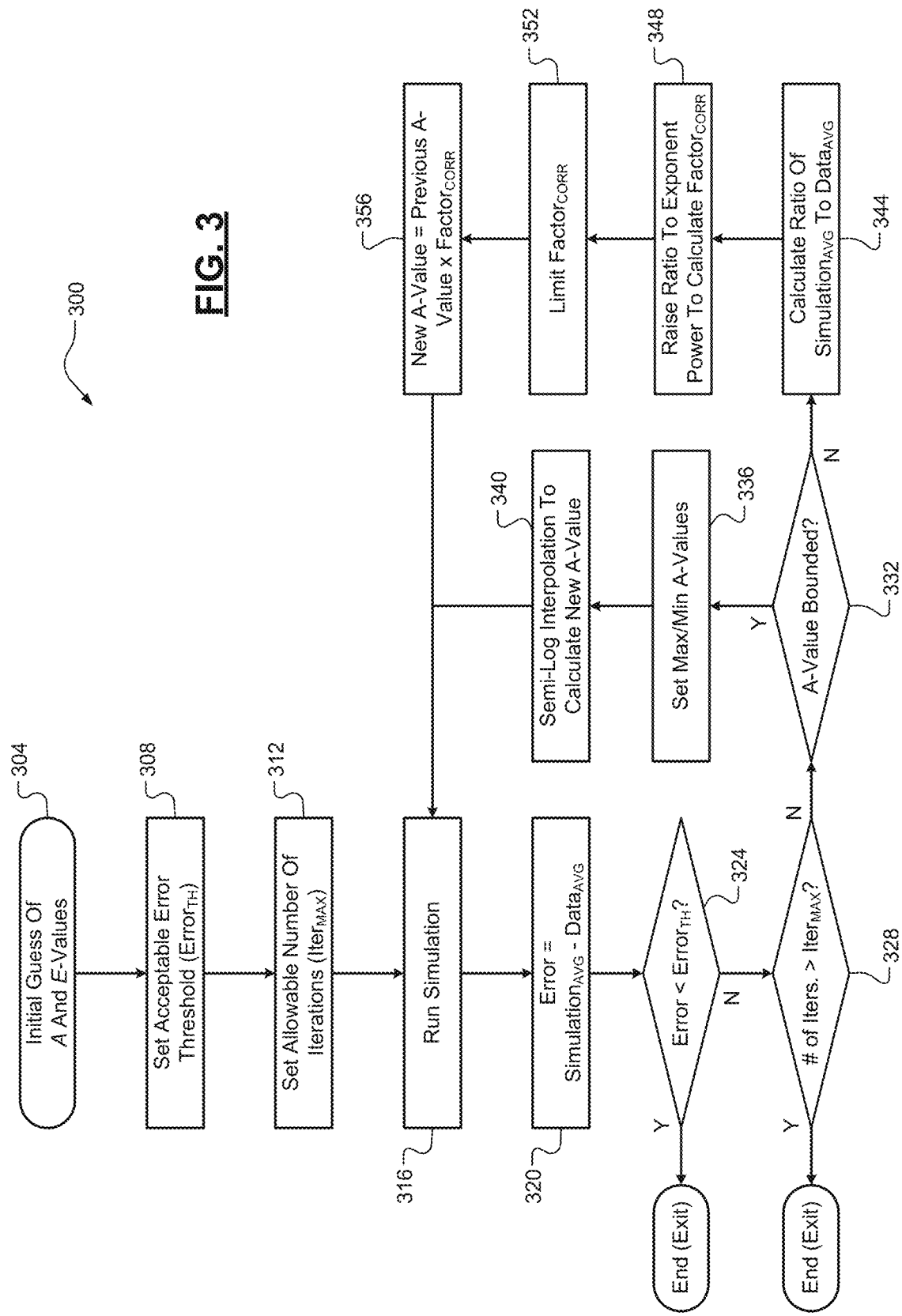
Figure 4A:
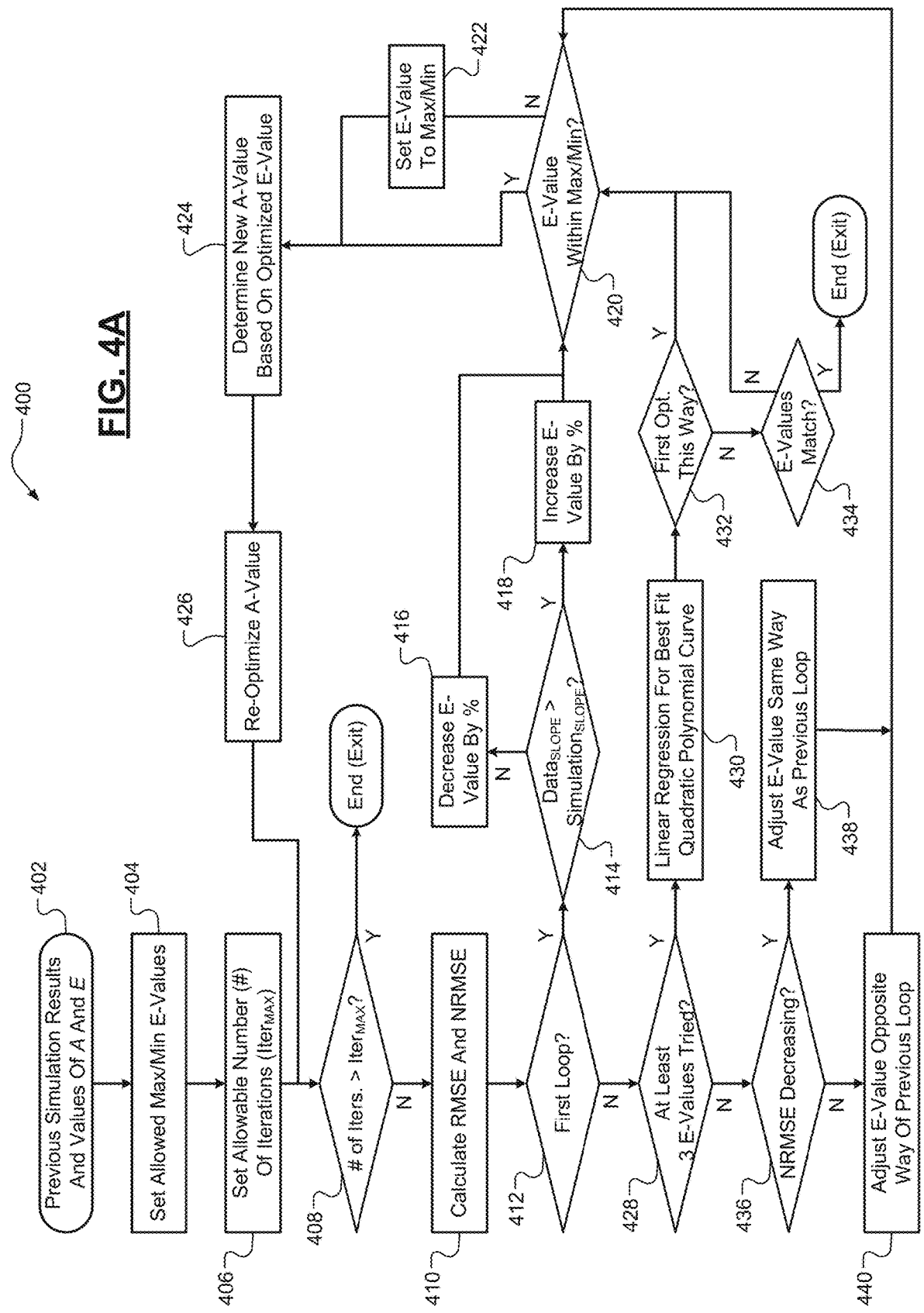

Referring now to FIGS. 3 and 4A-4B, flow diagrams of example calibration methods 300, 400, and 450 for catalyst models for an exhaust system catalyst according to the principles of the present application are illustrated. More specifically, FIG. 3 illustrates a flow diagram of an example A-value optimization method 300 and FIGS. 4A and 4B illustrate flow diagrams of two different example E-value optimization methods 400, 450. In FIG. 3, the method 300 begins at 304 where the computer system 212 sets initial values for the A-value and the E-value. These could be, for example, initial guesses of these values based on previously calibrated models, other parameters/factors, the stored test data, and/or from scholarly literature. At 308, the computer system 212 sets an acceptable error threshold ($Error_{TH}$). Ideally, the target error value would be zero, but a practical error threshold could be, for example, +/−2% or similar. At 312, the computer system 212 sets an allowable (maximum) number of iterations ($Iter_{MAX}$) for optimizing (tuning) the A-value (this is to avoid the possibility of an infinite loop). At 316, the computer system 212 runs the simulation (i.e., the catalyst model). At 320, the computer system 212 determines an error as a difference between an average of the simulation/model results ($Simulation_{AVG}$) and an average of the test data ($Data_{AVG}$) (e.g., [CO $Simulation_{AVG}$−CO $Data_{AVG}$]/CO $Data_{AVG}$, where CO $Simulation_{AVG}$ and CO $Data_{AVG}$ are the average simulation/model results for CO and average test data for CO, respectively). At 324, the computer system 212 determines whether the error (Error) is less than the error threshold $Error_{TH}$. When true, the optimal A-value might not be found, but the method 300 ends or exits (to avoid an infinite loop), e.g., perhaps the allowable number of iterations was set too low and the user might want to increase it. Otherwise, the method 300 continues to 328. At 328, the computer system 212 determines whether the number of iterations (# of Iters.) or loops has exceeded the allowable number of iterations $Iter_{MAX}$. When true, the optimal A-value is found and the method 300 ends or exits. Otherwise, the method 300 continues to 332. From 332 to 356, calculation and updating (i.e., optimization or tuning) of the A-value occurs.

Figure 5A:
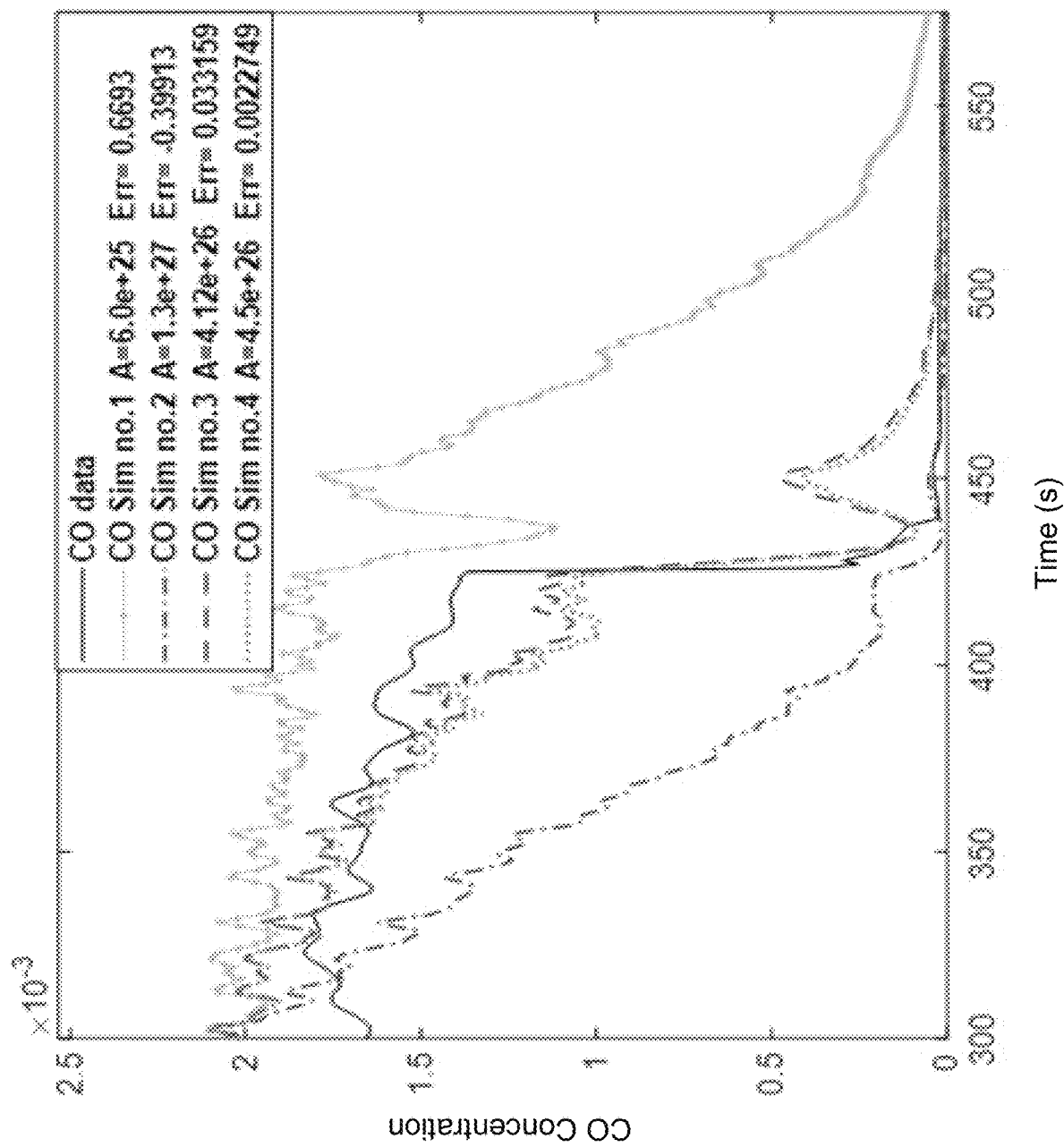
FIGS. 5A and 5B are plots of an example carbon monoxide (CO) light-off curve with progressively better A-values and an example A-value optimization (targeting zero CO error), respectively, according to the principles of the present application.
Figure 5B:
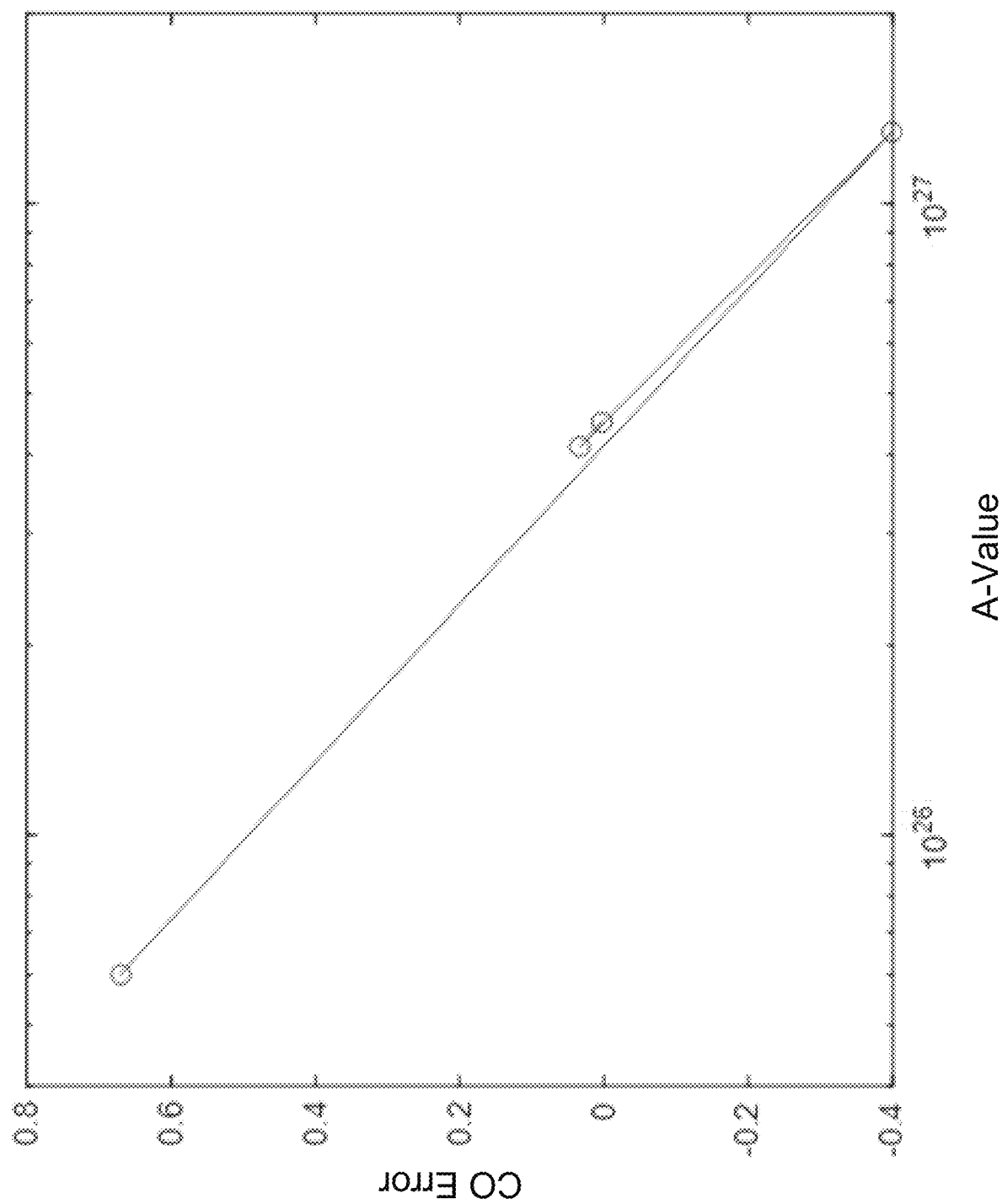

At 332, the computer system 212 determines whether the A-value has been bounded. This means that the error has gone from positive to negative or vice-versa. When true, the method 300 proceeds to 336. When false, the method 300 proceeds to 344. At 336, the computer system 212 sets maximum/minimum A-values based on the recent A-values that gave the closes results above and below the target. Once the optimal A-value has been bounded, at 340 the computer system 212 uses a semi-log interpolation between the maximum and minimum A-values to fine tune the A-value. The method 300 then returns to 316 where the simulation is run again. At 344, the computer system 212 calculates a ratio of (i) the simulation average $Simulation_{AVG}$ to (ii) the test data average $Data_{AVG}$ and at 348 the computer system 212 raises the ratio to an exponential power (e.g., 7) to calculate a correction factor ($Factorco_{RR}$). At 352, the computer system 212 limits the correction factor $Factorco_{RR}$. This limiting is performed, for example, if the correction factor $Factorco_{RR}$ is overly small (e.g., three orders of magnitude, or 0.001) to thereby limit the correction (i.e., to prevent the catalyst model from getting too drastic). At 356, the computer system 212 calculates a new (updated) A-value is calculated by multiplying the previous A-value by the correction factor $Factorco_{RR}$ and the method 300 returns to 316 where the simulation is run again. FIGS. 5A and 5B illustrate plots of an example CO light-off curve optimized with progressively better A-values and an example A-value optimization and A-value optimization (targeting zero CO error), respectively, according to the principles of the present application. As shown in FIG. 5A, the CO light-off curve becomes substantially more optimized with each better A-value iteration. In FIG. 5B, the CO error is both positive and negative as the A-value is optimized towards the zero error target as previously discussed herein.

In FIG. 4A, the method 400 begins at 402 where the computer system 212 retrieves the previous simulation results and the A-value and E-value (e.g., which could still be the initial E-value). At 404, the computer system 212 sets allowable maximum/minimum E-values (e.g., to keep the results within reason). At 406, the computer system 212 sets an allowable (maximum) number of iterations ($Iter_{MAX}$). At 408, the computer system 212 determines whether the number of iterations (# of Iters.) or loops has exceeded the allowable number of iterations $Iter_{MAX}$. When true, the optimal E-value is not found, but the method 400 ends or exits (to avoid the possibility of an infinite loop), e.g., the user may want to increase the allowable number of iterations. Otherwise, the method 400 continues to 410. At 410, the computer system 212 calculates the root mean squared error (RMSE) for each time step of the current simulation compared with the test data and calculates the overall normalized RMSE (NRMSE) by averaging the RMSE values and dividing by average concentration of the species from the test data. At 412, the computer system 212 determines whether this is the first time this loop has run. If this is not the first iteration of the loop, the method 400 proceeds to 428. At 428, the computer system 212 determines whether at least three E-values have been tried. When false, the method 400 proceeds to 436. When true, the method 400 proceeds to 430.

At 430, the computer system 212 makes a plot of the E-values on an x-axis and NRMSE on a y-axis. Then, the computer system 212 performs a linear regression to find a quadratic polynomial that best fits the curve (which is likely to be approximately parabolic). Using that polynomial formula, the computer system 212 finds the 'E' value which gives the minimum NRMSE. At 432, if the E-value was optimized in a previous iteration and the parabolic curve (with four points now) still points to the same optimized E-value, within a threshold (i.e., when the E-values "match"), then the E-value is optimized and the method 400 ends or exits. Otherwise, the method 400 proceeds to 420. At 436, the computer system 212 compares the NRMSE from this iteration versus a previous iteration. If the NRMSE is decreasing at 436, then the computer system 212 continues adjusting the E-value in the same direction (increasing or decreasing by a percentage) at 438 and the method 400 then proceeds to 420. If the NRMSE is not decreasing at 436, then the computer system 212 adjusts the E-value in the opposite direction at 440 and the method 400 then proceeds to 420. When 412 is true (i.e., the first iteration of the loop), the method 400 proceeds to 414. At 414, the computer system 212 determines the maximum slope (of the catalyst light-off curve) for the test data and compare this with the maximum slope (near the same time) of the simulation light-off curve.

If the test data slope ($Data_{SLOPE}$) is lower or less than the simulation slope ($Simulation_{SLOPE}$), the computer system 212 decreases the E-value by a percentage (%) at 416. Otherwise, when the test data slope $Data_{SLOPE}$ is higher or greater than the simulation slope $Simulation_{SLOPE}$, then the computer system 212 increases the E-value by a percentage % at 418. At 420, the computer system 212 determines whether the E-value is within the maximum/minimum range. When true, the method 400 moves forward with the E-value at 424. When false, the method 400 proceeds to 422 where the computer system 212 increases/decreases the E-value back into its maximum/minimum range. At 424, the computer system 212 calculates approximately what the new or updated A-value based on the optimized E-value should be. This could include, for example, finding where the simulated concentration matches the test data (near the point of max slope), taking the temperature at that point, and calculating the reaction rate constant k at that temperature. The reaction rate can be hinged on that temperature and the algebraic equation (1) can be rearranged so that a new A-value can be calculated (based on the optimized E-value and holding the reaction rate k constant. At 426, with the optimized E-value and the approximated new/updated A-value, the computer system 212 then runs the A-value optimization loop (e.g., method 300) again to optimize the A-value.

In FIG. 4B, the method 450 (steps 452-484) is quite similar to the method 400 (steps 402-434) of FIG. 4A, with the exception of a few different steps. The method 450 begins at 452 where the computer system 212 retrieves the previous simulation results and the A-value and E-value. At 454, the computer system 212 sets the allowable maximum/minimum E-values. At 456, the computer system 212 sets an allowable (maximum) number of iterations ($Iter_{MAX}$). At new 458, the computer system 212 sets an initial number (#) of E-values to try and, at new 460, the computer system 212 creates a series (e.g., a list) of E-values to run, arranged from a minimum to a maximum (e.g., ordered). At 462, the computer system 212 determines whether the number of iterations (# of Iters.) or loops has exceeded the allowable number of iterations $Iter_{MAX}$. When true, the optimal E-value is not found, but the method 450 ends or exits (this is to avoid a possible infinite loop), e.g., the user might want to increase the allowable number of iterations, or otherwise check the model and then restart the optimization procedure. Otherwise, the method 450 continues to 464. At 464, the computer system 212 calculates the RMSE for each time step of the current simulation compared with the test data and calculates the overall NRMSE by averaging the RMSE values and dividing by average concentration of the species from the test data. At 464, the computer system 212 calculates the RMSE for each time step of the current simulation compared with the test data and calculates the overall NRMSE by averaging the RMSE values and dividing by average concentration of the species from the test data.

At new 466, the computer system 212 determines whether the initial number E-values have been tried. When true, the method 450 proceeds to 468 where the computer system 212 runs the next E-value in the series/list and the method 450 continues to 470. When true, the method 450 proceeds to 476 where the computer system 212 makes a plot of the E-values on an x-axis and NRMSE on a y-axis. Then, the computer system 212 performs a linear regression to find a quadratic polynomial that best fits the curve (which is likely to be approximately parabolic). Using that polynomial formula, the computer system 212 finds the 'E' value which gives the minimum NRMSE. At new 478, the computer system 212 determines whether the polynomial (e.g., parabolic) curve is valley shaped (having a central bottom/minimum point), which is also equivalent to the second derivative of the polynomial being positive. When false, the method 450 proceeds to 480 where the computer system 212 increases the number of E-values to try (from the initial number of E-values) and the method 450 returns to 468. When true, the method 450 proceeds to 482 where the computer system 212 determines if the E-value was optimized in a previous iteration and whether, at 484, the parabolic curve still points to the same optimized E-value, within a threshold (i.e., when the E-values "match"), then the E-value is optimized and the method 450 ends or exits. Otherwise, the method 450 proceeds to 470.

At 470, the computer system 212 determines whether the E-value is within the maximum/minimum range. When true, the method 450 moves forward with the E-value at 474. When false, the method 450 proceeds to 482 where the computer system 212 increases/decreases the E-value back into its maximum/minimum range. At 474, the computer system 212 calculates approximately what the new or updated A-value based on the optimized E-value should be. This could include, for example, finding where the simulated concentration matches the test data (near the point of max slope), taking the temperature at that point, and calculating the reaction rate constant k at that temperature. The reaction rate can be "hinged" on that temperature and the algebraic equation (1) can be rearranged so that a new A-value can be calculated (based on the optimized E-value and holding the reaction rate k constant). At 476, with the optimized E-value and the approximated new/updated A-value, the computer system 212 then runs the A-value optimization loop (e.g., method 300) again to optimize the A-value.

As previously mentioned, the techniques are primarily designed to optimize a species concentration based on a reaction that consumes that species. CO concentration, for example, is consumed in the $CO + \frac{1}{2}O_2 \rightarrow CO_2$ reaction.

Figure 6A:
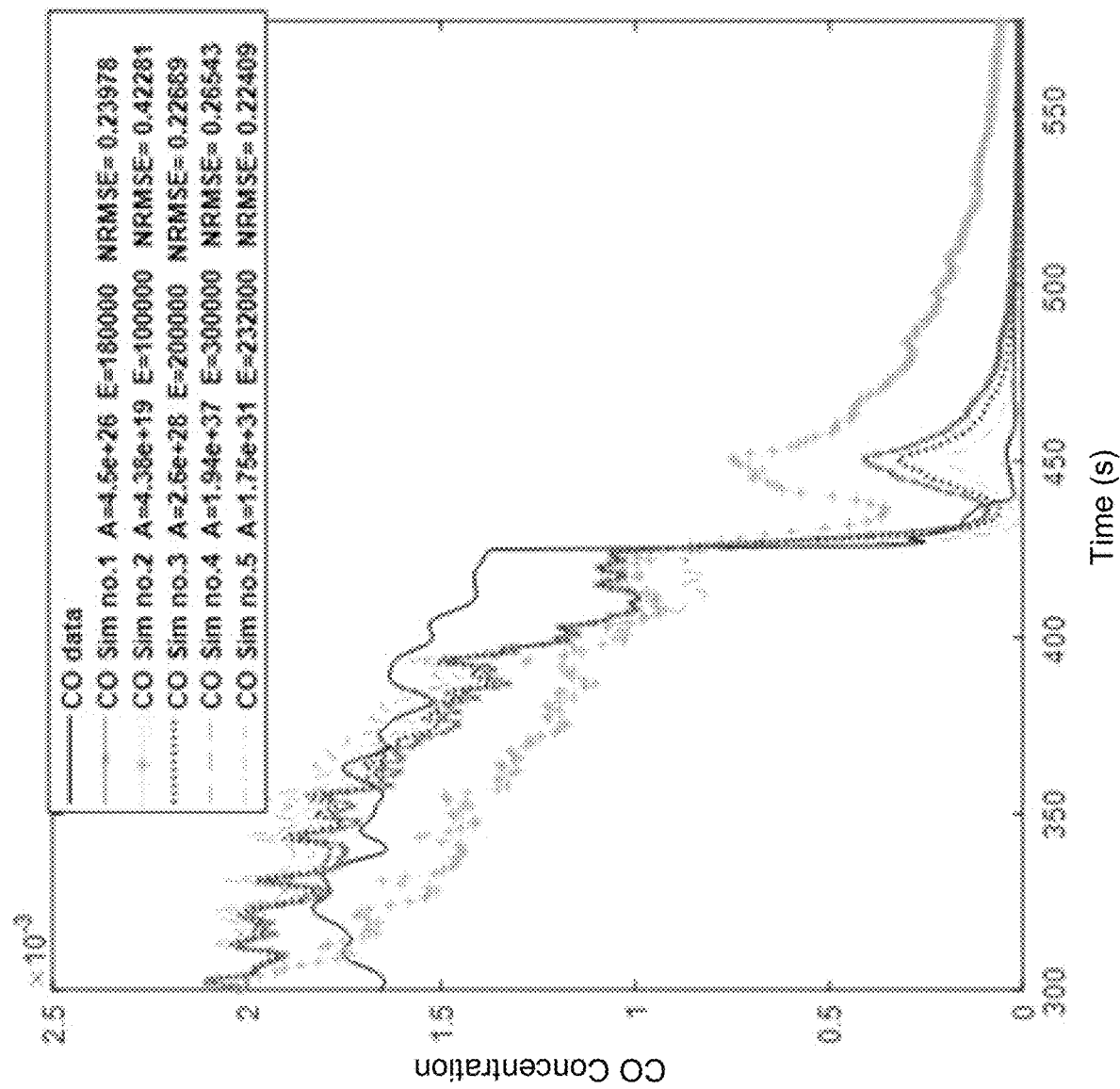
FIGS. 6A and 6B are plots of an example CO light-off curve optimized with progressively better E-values and an example E-value optimization and a normalized root mean squared error (NRMSE) curve fit to find the best E-value, respectively, according to the principles of the present application.
Figure 6B:
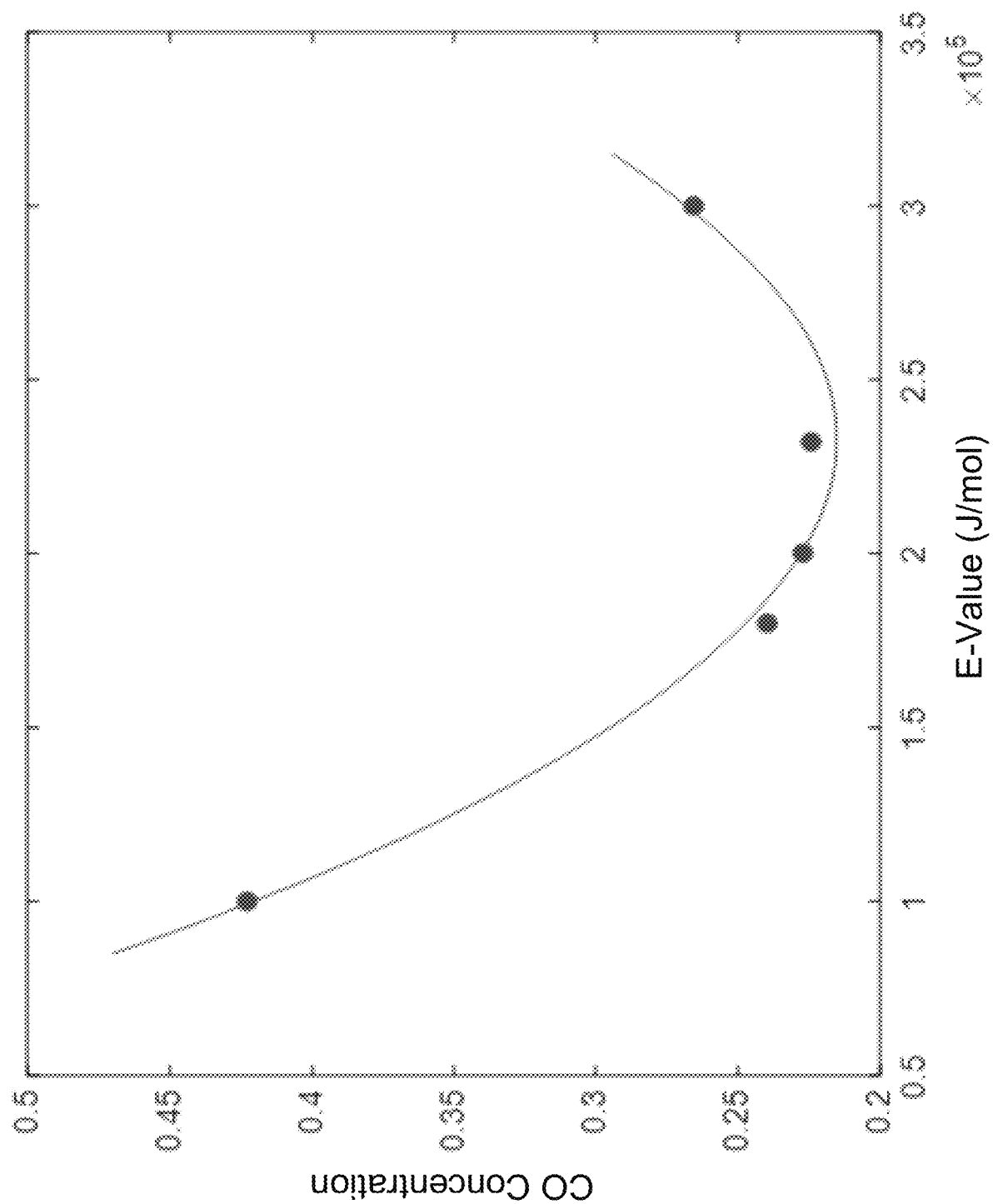

FIGS. 5A and 5B illustrate plots of an example CO light-off curve optimized with progressively better E-values and an example E-value optimization, E-value versus NRMSE plot, and a curve fit to find the best E-value, respectively, according to the principles of the present application. As shown in FIG. 6A, the CO light-off curve becomes substantially more optimized with each better E-value iteration. In FIG. 6B, a valley shaped (or positive second derivative) polynomial curve as previously discussed herein is shown. It will be appreciated that the model could also be applicable to exhaust gas components generated by the exhaust system catalyst 104, 216 during its operation. One example generated exhaust gas component is ammonia $NH_3$, such as in the following reaction by a three-way catalytic converter: $NOx+ 5/2CO+3/2H_2O \rightarrow NH_3+5/2CO_2$. It may be desirable to track the generation and treatment/conversion of such generated exhaust gas components via the calibrated models of the present application, such as to meet government emissions regulations. The process of calibrating the model for such a generated exhaust gas component is relatively similar to the previously described techniques relating to end/tailpipe emissions components, with one key distinction. This key distinction is that optimizing the A-value and the E-value for the generated exhaust gas component catalyst model calibration involves iteratively multiplying the A-value based on an inverse of the limited correction factor (i.e., $1/Factor_{CORR}$). Basically, the difference is that instead of calculating the correction factor based on simulation/data, we need to do the opposite data/simulation or, equivalently, we can take the correction factor and invert it. Thus, we would take the A-value and instead of multiplying it by the correction factor, we multiply it by the inverse ($1/Factor_{CORR}$). The optimization of the E-value for a generated species (such as $NH_3$ or $N_2O$) can be the same method as before as long as it references the revised A-value optimization method.

It will be appreciated that the term "controller" as used herein refers to any suitable control device or set of multiple control devices that is/are configured to perform at least a portion of the techniques of the present application. Non-limiting examples include an application-specific integrated circuit (ASIC), one or more processors and a non-transitory memory having instructions stored thereon that, when executed by the one or more processors, cause the controller to perform a set of operations corresponding to at least a portion of the techniques of the present application. The one or more processors could be either a single processor or two or more processors operating in a parallel or distributed architecture.

It should also be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. A calibration system for a catalyst model for a catalyst, the calibration system comprising:
   a test data database configured to store test data relating to the operation and production of exhaust gas by a source and treatment of the exhaust gas by the catalyst; and
   a computer system configured to generate and calibrate the catalyst model for a chemical reaction by the catalyst, the catalyst model being based on the Arrhenius equation and defined by an A-value representing a pre-exponential factor and an E-value representing an activation energy, including:
      optimizing the A-value by running the catalyst model and adjusting the A-value until results of the catalyst model are within a first threshold of the test data and setting the A-value to the optimized A-value;
      optimizing the E-value by running the catalyst model and adjusting the E-value until the catalyst model results are minimized relative to the test data within a second threshold of the test data;
      determining a new A-value based on the optimized E-value and setting the A-value to the new A-value and the E-value to the optimized E-value; and
      determining a reoptimized A-value by running the catalyst model and adjusting the A-value until the catalyst model results are within a third threshold of the test data.

2. The calibration system of claim 1, wherein the catalyst is an exhaust system catalyst and the source is an internal combustion engine of a vehicle, and wherein the computer system is further configured to determine whether the exhaust system catalyst is suitable for a particular vehicle application based on the calibrated catalyst model.

3. The calibration system of claim 1, wherein the computer system is configured to optimize the A-value by iteratively:
   determining an error between an average of the catalyst model results and an average of the test data;
   when the error is less than an error threshold, determining the optimized A-value;
   when the error is not less than the error threshold, calculating a ratio between the average catalyst model results to the average test data;
   calculating a limited correction factor by raising the calculated ratio to a power of an exponent;
   multiplying the A-value by the limited correction factor;
   determining whether the A-value is bounded; and
   tuning the A-value based on a semi-log interpolation.

4. The calibration system of claim 3, wherein the computer system is configured to optimize the E-value by:
   setting maximum/minimum values for the E-value, a maximum number of iterations, and a number of iterations to try, and determining a series of the E-values based thereon; and
   optimizing the E-value by iteratively:
      calculating root-mean squared error (RMSE) for each time step of the catalyst model results and the test data;
      calculating normalized RMSE (NRMSE) by averaging the RMSE values and dividing by an average of the test data;
      when the number of iterations has been complete, calculating a linear regression to find a best fit quadratic polynomial curve; and
      determining the optimized E-value that corresponds to the minimum NRMSE.

5. The calibration system of claim 4, wherein the computer system is further configured to set the number of iterations to try equal to three.

6. The calibration system of claim 4, wherein the computer system is further configured to set the number of iterations to an initial number of iterations to try and determining the series of E-values based thereon; and
   wherein optimizing the E-value includes:
      determining whether the quadratic polynomial curve is valley shaped having a positive second derivative or hill shaped having a negative second derivative; and when the quadratic polynomial curve is hill shaped, increasing the number of iterations to try.

7. The calibration system of claim 1, wherein the catalyst is an exhaust system catalyst and the source is an internal combustion engine of a vehicle, and wherein the exhaust system catalyst is a three-way catalytic converter configured to mitigate or eliminate exhaust gas components including carbon monoxide (CO), hydrocarbons (HC), and nitrogen oxides (NOx), and wherein the calibrated catalyst model is for a chemical reaction of one of CO, HC, and NOx.

8. The calibration system of claim 4, wherein the catalyst is configured to generate an intermediate exhaust gas component during treatment of the exhaust gas, and wherein the calibrated catalyst model is for this intermediate exhaust gas component.

9. The calibration system of claim 8, wherein the computer system is configured to calibrate the catalyst model for the intermediate exhaust gas component by optimizing the A-value and the E-value by iteratively multiplying the A-value based on an inverse of the limited correction factor.

10. The calibration system of claim 9, wherein the intermediate exhaust gas component is ammonia ($NH_3$).

11. A calibration method for a catalyst model for a catalyst, the calibration method comprising:
  establishing a test data database storing test data relating to the operation and production of exhaust gas by a source and treatment of the exhaust gas by the catalyst;
  generating, by a computer system, a model for a chemical reaction by the catalyst, the model being based on the Arrhenius equation and defined by an A-value representing a pre-exponential factor and an E-value representing an activation energy; and
  calibrating, by the computer system, the catalyst model by:
    optimizing the A-value by running the catalyst model and adjusting the A-value until results of the catalyst model are within a first threshold of the test data and setting the A-value to the optimized A-value;
    optimizing the E-value by running the catalyst model and adjusting the E-value until the catalyst model results are minimized relative to the test data within a second threshold of the test data;
    determining a new A-value based on the optimized E-value and setting the A-value to the new A-value and the E-value to the optimized E-value; and
    determining a reoptimized A-value by running the catalyst model and adjusting the A-value until the catalyst model results are within a third threshold of the test data.

12. The calibration method of claim 11, wherein the catalyst is an exhaust system catalyst and the source is an internal combustion engine of a vehicle, and further comprising determining, by the computer system, whether the exhaust system catalyst is suitable for a particular vehicle application based on the calibrated catalyst model.

13. The calibration method of claim 11, wherein optimizing the A-value further comprises iteratively:
  determining an error between an average of the catalyst model results and an average of the test data;
  when the error is less than an error threshold, determining the optimized A-value;
  when the error is not less than the error threshold, calculating a ratio between the average catalyst model results to the average test data;
  calculating a limited correction factor by raising the calculated ratio to a power of an exponent;
  multiplying the A-value by the limited correction factor;
  determining whether the A-value is bounded; and
  tuning the A-value based on a semi-log interpolation.

14. The calibration method of claim 13, wherein optimizing the E-value further comprises:
  setting, by the computer system, maximum/minimum values for the E-value, a maximum number of iterations, and a number of iterations to try, and determining a series of the E-values based thereon; and
  optimizing, by the computer system, the E-value by iteratively:
    calculating root-mean squared error (RMSE) for each time step of the catalyst model results and the test data;
    calculating normalized RMSE (NRMSE) by averaging the RMSE values and dividing by an average of the test data;
    when the number of iterations has been complete, calculating a linear regression to find a best fit quadratic polynomial curve; and
    determining the optimized E-value that corresponds to the minimum NRMSE.

15. The calibration method of claim 14, wherein the computer system is further configured to set the number of iterations to try equal to three.

16. The calibration method of claim 14, wherein:
  setting the number of iterations includes setting the number of iterations to an initial number of iterations to try and determining the series of E-values based thereon; and
  wherein optimizing the E-value includes:
    determining whether the quadratic polynomial curve is valley shaped having a positive second derivative or hill shaped having a negative second derivative; and
    when the quadratic polynomial curve is hill shaped, increasing the number of iterations to try.

17. The calibration method of claim 11, wherein the catalyst is an exhaust system catalyst and the source is an internal combustion engine of a vehicle, and wherein the exhaust system catalyst is a three-way catalytic converter configured to mitigate or eliminate exhaust gas components including carbon monoxide (CO), hydrocarbons (HC), and nitrogen oxides (NOx), and wherein the calibrated catalyst model is for a chemical reaction of one of CO, HC, and NOx.

18. The calibration method of claim 14, wherein the catalyst is configured to generate an intermediate exhaust gas component during treatment of the exhaust gas, and wherein the calibrated catalyst model is for this intermediate exhaust gas component.

19. The calibration method of claim 18, wherein calibrating the catalyst model for the intermediate exhaust gas component comprises optimizing, by the computer system, the A-value and the E-value by iteratively multiplying the A-value based on an inverse of the limited correction factor.

20. The calibration method of claim 19, wherein the intermediate exhaust gas component is ammonia ($NH_3$).

* * * * *